(12) United States Patent
Lee

(10) Patent No.: US 7,386,829 B2
(45) Date of Patent: Jun. 10, 2008

(54) METHOD OF FABRICATING A PHOTOMASK

(75) Inventor: Jun Seok Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 714 days.

(21) Appl. No.: 11/024,658

(22) Filed: Dec. 30, 2004

(65) Prior Publication Data

US 2005/0142460 A1    Jun. 30, 2005

(30) Foreign Application Priority Data

Dec. 31, 2003    (KR) ...................... 10-2003-0101353

(51) Int. Cl.
*G06F 17/50* (2006.01)
*G03F 1/00* (2006.01)
(52) U.S. Cl. .............................. 716/19; 430/5
(58) Field of Classification Search ............ 716/19–21; 430/5
See application file for complete search history.

(56) References Cited

U.S. PATENT DOCUMENTS

| 6,794,118 | B2 * | 9/2004 | Okamoto et al. ............ 430/311 |
| 2002/0166107 | A1 * | 11/2002 | Capodieci et al. ............ 716/19 |
| 2002/0177050 | A1 * | 11/2002 | Tanaka .......................... 430/5 |
| 2004/0003368 | A1 * | 1/2004 | Hsu et al. ...................... 716/19 |
| 2005/0044513 | A1 * | 2/2005 | Robles et al. .................. 716/4 |
| 2007/0214448 | A1 * | 9/2007 | Hsu et al. ...................... 716/19 |

\* cited by examiner

*Primary Examiner*—Stacy Whitmore
(74) *Attorney, Agent, or Firm*—Lowe Hauptman Ham & Berner LLP

(57) ABSTRACT

A method of fabricating a photomask automatically generates a microscopic supplementary pattern by selective sizing to reduce a product cost and by which a precise line width is provided in a manner of decreasing unnecessary microscopic supplementary patterns to raise precision of a photomask pattern. The method includes the steps of selectively carrying out a sizing on a main pattern to form a microscopic supplementary pattern with a difference of the corresponding sizing and selectively removing the microscopic supplementary pattern.

7 Claims, 6 Drawing Sheets

METHOD OF FABRICATING A PHOTOMASK

BACKGROUND OF THE INVENTION

1. Field of the Invention

The present invention relates to a method of fabricating a photomask, and more particularly, to a method of fabricating a microscopic hole photomask, in which line width patterning is appropriately compensated by a supplementary pattern and by which a precise line width can be provided.

2. Discussion of the Related Art

Generally, a photomask pattern directly affects a precision of a real pattern formed on a semiconductor substrate. If an optical proximity effect of the photomask pattern fails to be correctly taken into consideration, a pattern line width is distorted, unlike the intended exposure of a photolithography process. Hence, line width linearity is shortened to degrade semiconductor device characteristics.

In a method of fabricating a microscopic photomask according to a related art, even if design line widths, as shown in FIG. 1, are equal to each other regardless of a density of contact hole patterns, the optical proximity effect showing a light interference difference due to exposure intensity occurs in a real exposure, as shown in FIG. 2. Specifically, the difference in resolution is severe for a particular hole or holes in a contact hole mask. For instance, a hole 1B in a dense area of a mask is formed with greater proximity to adjacent holes than a more isolated hole, such as hole 1A which is formed in a sparse area. Hence, the quality of a hole that can be made in photoresist for hole A in the sparse area considerably differs (in a negative way) from a hole B formed in a more dense area in resolution.

However, since the related art method needs a supplementary pattern for controlling the optical proximity effect to overcome such a problem, time is wasted in fabricating the photomask and the number of the supplementary patterns increases in the photomask. Hence, the precision of the photomask pattern is lowered and is not able to yield precise critical dimensions.

SUMMARY OF THE INVENTION

Accordingly, the present invention is directed to a method of fabricating a photomask that substantially obviates the above-identified and other problems due to limitations and disadvantages of the related art.

An object of the present invention is to provide a method of fabricating a photomask, in which a microscopic supplementary pattern is automatically generated by selective sizing to reduce a product cost and by which a precise line width is provided in a manner of decreasing unnecessary microscopic supplementary patterns to raise the precision of a photomask pattern.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purposes of the invention, as embodied and broadly described herein, a method of fabricating a photomask according to the present invention includes the steps of selectively carrying out a sizing on all hypotenuses of a main pattern to form a microscopic supplementary pattern with a difference of the corresponding sizing and selectively removing the microscopic supplementary pattern.

Preferably, the main pattern comprises an opening for a contact hole and a shield part.

In another aspect of the present invention, a method of fabricating a photomask includes a first step of selectively carrying out a same sizing on all hypotenuses of a main pattern to adjust a size of the main pattern, a second step of selectively carrying out the same sizing on all the hypotenuses of the main pattern to adjust the size of the main pattern differently, a third step of subtracting a pattern of a small line width from a pattern of a large line width among the patterns formed in the first and second steps and adding an original main pattern thereto, a fourth step of selectively carrying out the same sizing on all the hypotenuses of the main pattern to enlarge the size of the main pattern into an overall mask applying area, and a fifth step of subtracting the pattern formed in the third step from the main pattern enlarged into the overall mask applying area.

Preferably, the main pattern includes an opening for a contact hole and a shield part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First of all, in the present invention, a microscopic supplementary pattern is separated from a main pattern to leave a prescribed distance in-between to fabricate a photomask having no line width difference between holes in sparse and dense areas. Specifically, the microscopic supplementary pattern is inserted while the distance between the main and microscopic supplementary patterns is fixed.

The microscopic supplementary pattern is a microscopic pattern having a critical dimension below a solution limit. The microscopic pattern exists on the photomask but fails to be formed on a semiconductor substrate after exposure. The pattern resolution is determined by Rayleigh's Equation of 'R(resolution)=k*λ/N.A., where k, λ, and N.A. are constant, illumination system wavelength, and lens aperture of illumination system, respectively'. If k, λ, and N.A. are set to 0.5, 0.248, and 0.65, respectively, R=0.19 μm. In case of independently applying a microscopic pattern having a line width smaller than 0.19 μm, light physically passes through the photomask but fails to be imaged in photoresist.

A method of fabricating a photomask according to the present invention is explained as follows.

FIGS. 3 to 10 are layouts for explaining a method of fabricating a photomask according to the present invention.

Figure 3:
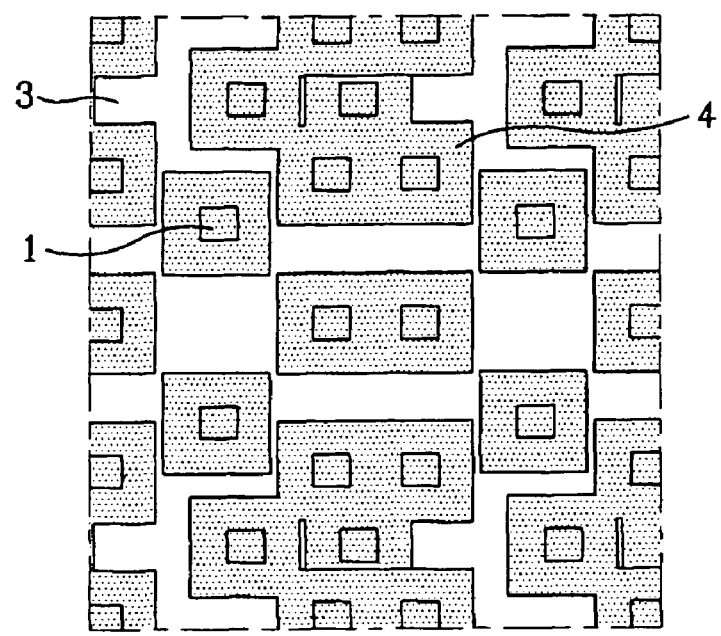
FIGS. 3 to 10 are layouts for explaining a method of fabricating a photomask according to the present invention.

Referring to FIG. 3, sizing is carried out on all hypotenuses according to a design rule, such as a contact hole on a design drawing having contact holes 1 according to a 0.18 μm design rule and a remaining part 3, except the extended hole areas 4 is reduced. In doing so, the contact holes 1 and 4 are openings and the remaining part 3 is a shield part. The extended hole areas 4 define areas of higher contact hole density than that of contact holes 1, which are isolated. What is to be noticed is the relatively large 2-dimensional areas of the remaining parts 3. The present inventor recognized that by having the large 2-dimensional areas of the remaining parts, is symptomatic of more isolated areas, which pose a challenge for making high precision contact holes due to the difficulty in realizing the required resolution as discussed above. In a more ideal situation, the remaining parts would have one dimension that is smaller than the resolution of the optical system. Visually, a better layout would be one where a large percentage of the remaining parts 3 would appear as long, narrow lines, have a width smaller than the system resolution.

Figure 4:
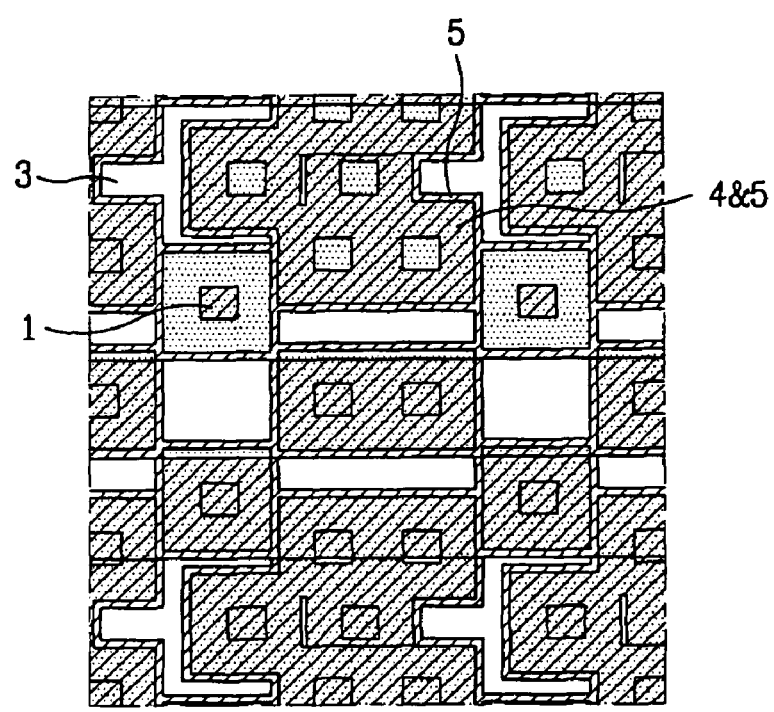

Referring to FIG. 4, another sizing operation is carried out on the original contact hole 1 to enlarge it by 0.05 μm by the same method discussed in reference to FIG. 3. In doing so, a sizing part 5 is selectively applied to a border of parts 4 and 1 enlarging them by 0.05 μm. If however the enlarged parts would encroach an area of an adjacent part, the enlarged parts are made to overlap one another.

Next mask data of FIG. 3 is subtracted from the mask data of FIG. 4, and then the original contact hole information is added to the difference.

Figure 5:
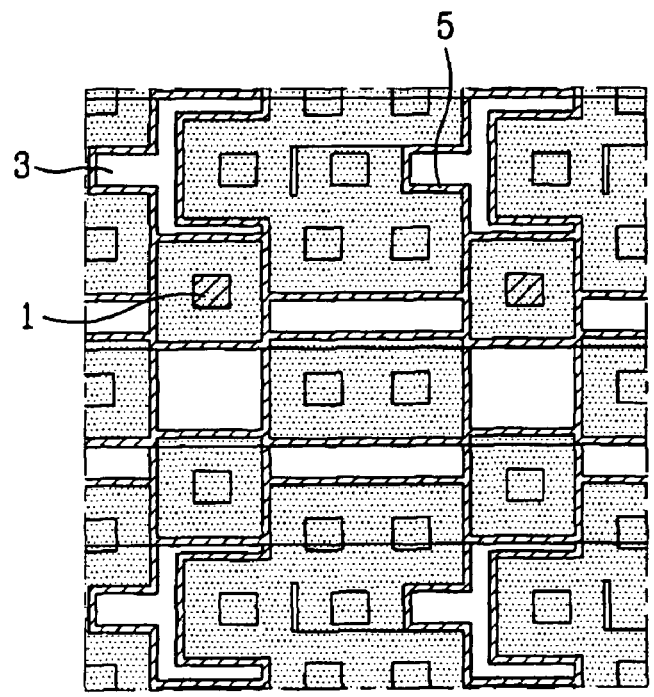

FIG. 5 shows a result of adding the original contact hole 1 to the data resulting from subtraction of the mask data of FIG. 3 from the mask data of FIG. 4, in which a part to be realized as a pattern corresponds to the original contact hole 1 and the 0.05 μm-enlarged sizing part 5.

Figure 6:
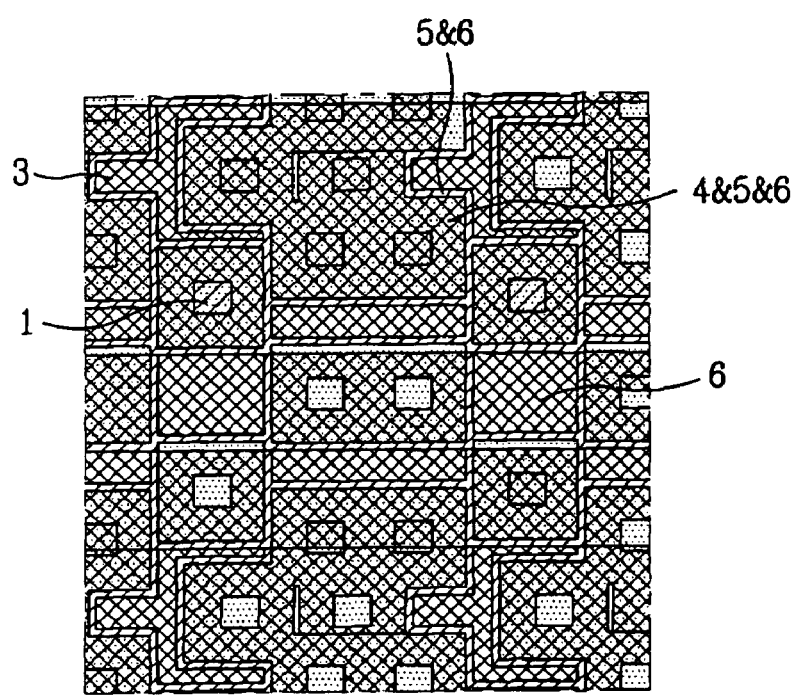

While the mask data is subtracted in the above manner, resizing is carried out yet again so as to avoid leaving large two-dimensional shield parts (where "large" refers to a dimension larger than the system's resolution). FIG. 6 shows a result of the resizing carried out so as to avoid leaving any of the shield parts 3, in which all "remaining parts" appear as an opening. In doing so, the shield parts 3 and 6 prior to the overall sizing and the original contact hole 1 are overlapped to simultaneously present the enlarged parts 4 & 5 & 6 and 5 & 6. Namely, the remaining shield parts 3 and 6 are transformed so as to be viewed as opening areas.

Figure 7:
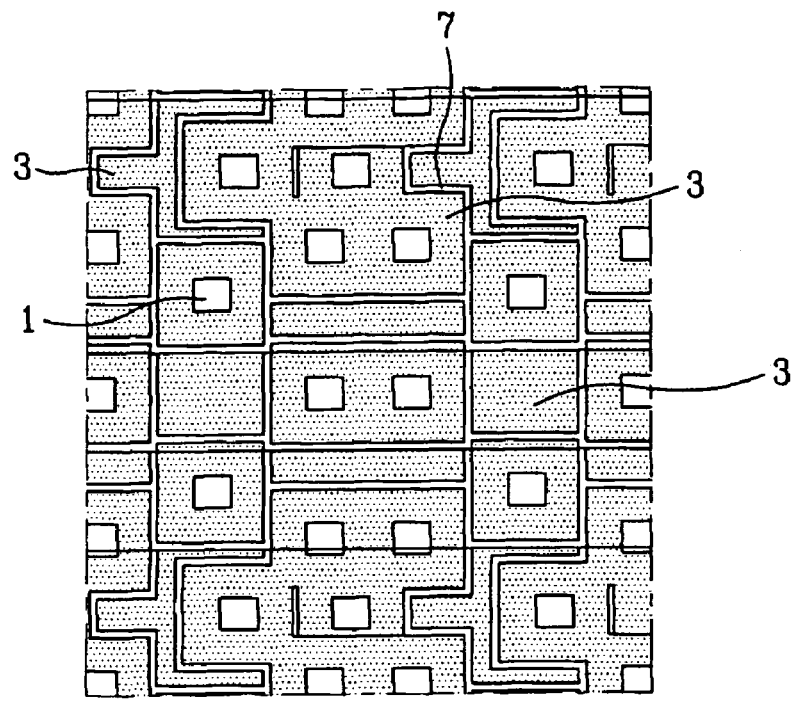

Subsequently, by the subtraction of mask data of FIG. 5 from mask data of FIG. 6, a photomask is prepared. FIG. 7 shows a real drawing of a final photomask resulting from subtracting mask data of FIG. 5 from mask data of FIG. 6. Namely, a microscopic supplementary pattern is automatically arranged in the vicinity of the isolated contact hole according to the design rule to contribute to patterning of a contact hole mask. The microscopic supplementary pattern 7 is unable to substantially provide a pattern to photoresist on a semiconductor substrate due to a resolution limit of an exposure machine.

The above-explained method of fabricating the microscopic hole photomask according to the present invention can be expressed by Bool Equation as follows.

$$A1 = \text{bias}(0.220, A0), \text{ where } A0 \text{ is original contact hole data,}$$

$$A2 = \text{bias}(0.270, A0),$$

$$A3 = (A2-A1)+A0,$$

$$A4 = \text{bias}(0.900, A0), \text{ and}$$

$$A5 = (A4-A3).$$

Namely, A1, A2, A3, A4, and A5 correspond to the sizings in FIG. 3, FIG. 4, FIG. 5, FIG. 6, and FIG. 7, respectively.

Figure 8:
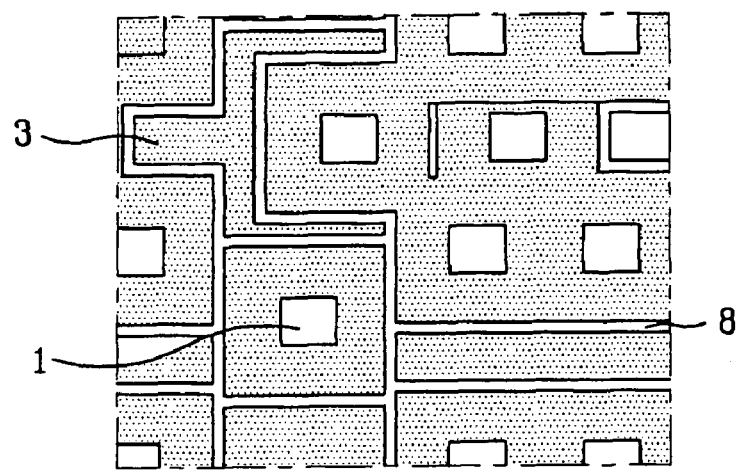
Figure 9:
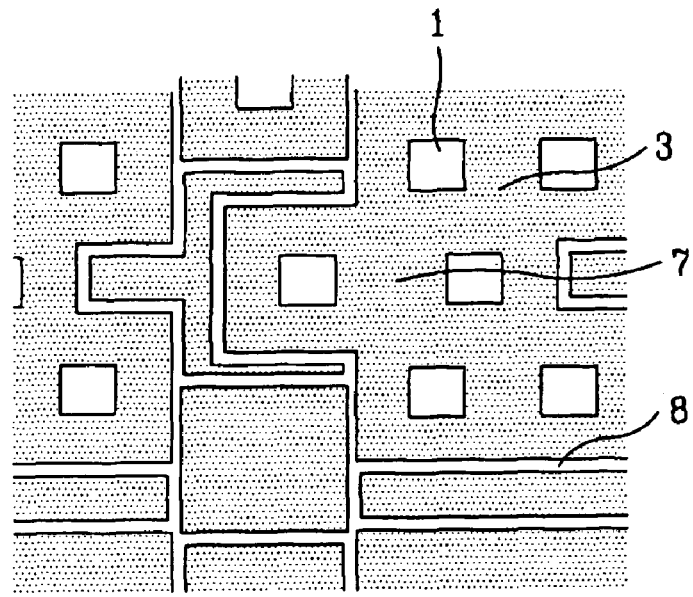

In case of removing an unnecessary microscopic supplementary pattern existing in a vertical direction, sizing by +0.015 μm is performed on the result of FIG. 7 and sizing is performed again by (−)0.015 μm. Hence, the unnecessary microscopic supplementary pattern 7 is removed as shown in FIG. 8. FIG. 9 shows a result after removing the unnecessary supplementary pattern 7, in which the unnecessary supplementary pattern 7 is turned into the shield part. Hence, it is able to reduce a size of the unnecessary supplementary pattern.

Figure 10:
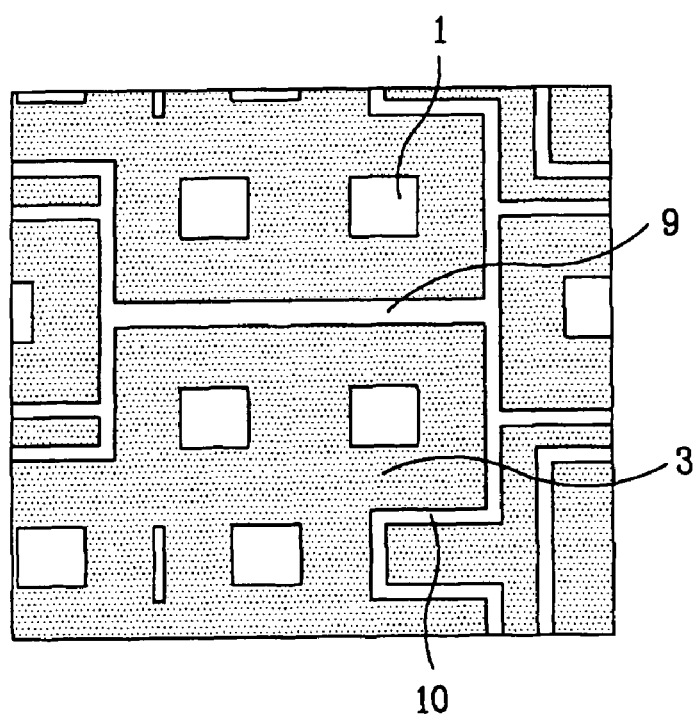

In case of removing an unnecessary microscopic supplementary pattern existing in a vertical and horizontal direction, sizing by +0.030 μm is performed on the result of FIG. 7 and sizing is performed again by (−)0.030 μm. Hence, the unnecessary microscopic supplementary pattern 10 is removed as shown in FIG. 10.

Using the unnecessary microscopic supplementary pattern removing method, one is able to perform contact hole patterning with minimum supplementary patterns only. A process of removing the unnecessary microscopic supplementary patterns is expressed by Bool Equations as follows.

$$A6 = \text{Over\_Under\_Size}(0.015, A5)$$

$$A7 = \text{Over\_Under\_Size}(0.030, A5)$$

In the above equations, A6 corresponds to a result of ±0.015 μm sizing and A7 corresponds to a result of ±0.030 μm sizing by taking A5 as a reference.

Figure 1:
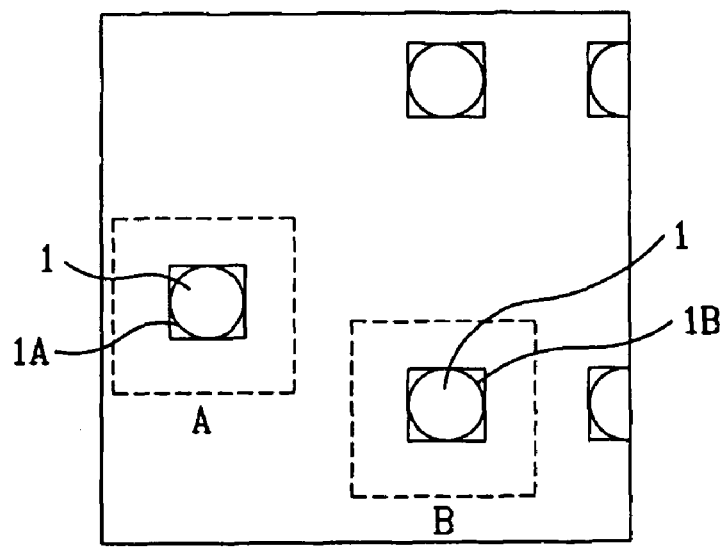
FIG. 1 is a layout of a photomask according to a related art.
Figure 2:
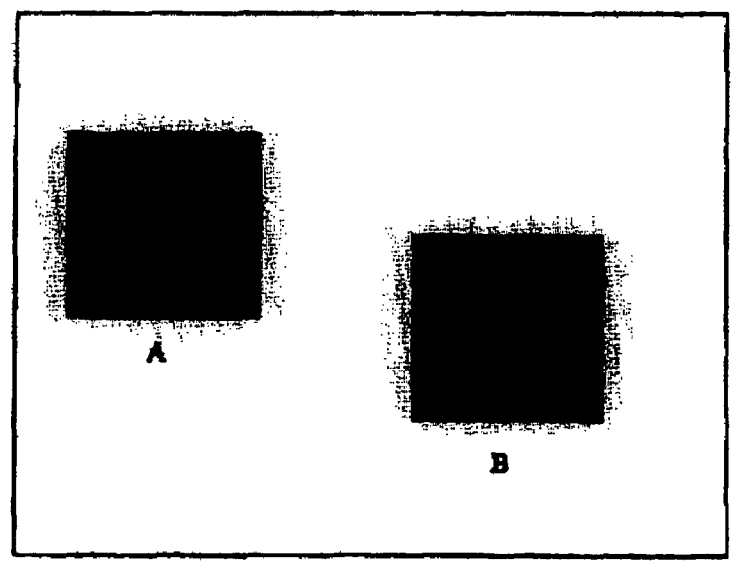
FIG. 2 is a resolution photograph of photoresist using a photomask according to a related art.
Figure 11:
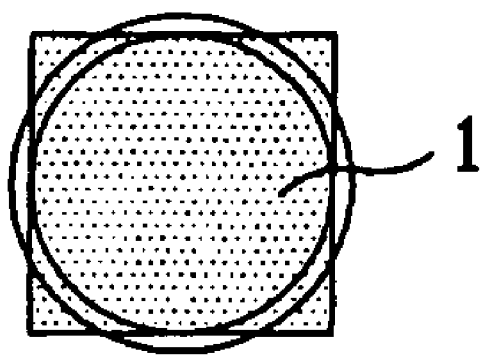
FIG. 11 is a layout of holes after exposure using a photomask according to the present invention.
Figure 11:
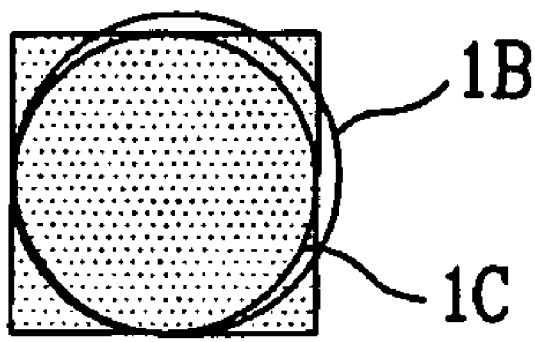
Figure 11:
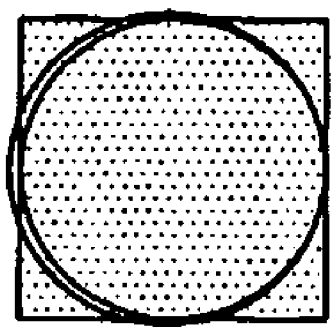

Comparing exposure results of the application of the photomask of the present invention to the related art photomask in FIG. 1 under the same condition, the related art hole image 1B, as shown in FIG. 11, is more irregular in hole formation than the hole image 1C of the present invention.

Accordingly, the present invention automatically generates the microscopic supplementary pattern by the selective sizing to avoid the separate microscopic supplementary pattern formation, thereby fabricating the microscopic hole photomask economically.

And, the present invention determines the separated distance of the microscopic supplementary pattern by accurate automatic distance calculation, thereby providing the accurate effect of the microscopic supplementary pattern.

Moreover, the present invention automatically forms the microscopic supplementary pattern in the vicinity of the contact hole to reduce a mask fabrication time considerably, thereby fabricating the microscopic hole photomask economically.

Moreover, the present invention considerably reduces the size of the microscopic supplementary pattern by the selective sizing, thereby facilitating the data base processing.

Furthermore, the present invention removes the unnecessary microscopic supplementary pattern to raise the precision of the mask pattern and the depth of a focus of a contact hole, thereby forming the precise line width. Calculations may be performed on a personal computer or workstation configured to process the Bool equations as discussed above, and in view of the present teachings.

This application claims the benefit of the Korean patent application No. P2003-0101353 filed on Dec. 31, 2003, the entire contents of which is hereby incorporated by reference.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a photomask, comprising steps of:
    (a) selectively carrying out a same sizing of a common feature distributed throughout an original main pattern in occupied parts and a remaining part, said sizing being consistent with a predetermined design rule, and said remaining part being void of said common feature and having a two dimensional area that is greater in each dimension than a system resolution;
    (b) selectively carrying out another sizing with the common feature being increased by a predetermined amount, and representing any overlapping areas as a single predetermined amount;
    (c) subtracting a result of step (b) and step (a) and adding the original main pattern to a subtraction result;
    (d) selectively identifying the remaining part as including the common feature so as to remove the remaining part; and
    (e) subtracting a resulting pattern formed in step (d) from a result of step (c) to form a resulting photomask, wherein
    said resulting photomask having a resulting remaining part that is two dimensional and a shortest dimension thereof being less than a system resolution.

2. The method of claim 1, wherein the common feature is contact hole and the remaining part is a shield part.

3. The method of claim 1, wherein the method is a computer implemented method.

4. The method of claim 3, wherein step (b) is performed by expressing a result as $A1=\text{bias}(x, A0)$, where x is a predetermined fraction and $A0$ is original contact hole data.

5. The method of claim 4, wherein $x=0.220$.

6. The method of claim 5, wherein step (c) is represented as $A3=(A2-A1)+A0$, where $A2=\text{bias}(0.270, A0)$.

7. The method of claim 6, wherein the resulting photomask is represented as $A5=(A4-A3)$, where $A4=\text{bias}(0.900, A0)$.

* * * * *